(12) United States Patent
Tojo et al.

(10) Patent No.: US 7,209,504 B2
(45) Date of Patent: Apr. 24, 2007

(54) SOLID LASER APPARATUS

(75) Inventors: Koji Tojo, Sagamihara (JP); Satoshi Irikuchi, Atsugi (JP); Kazuma Watanabe, Hatano (JP); Tunehiro Sugimoto, Atsugi (JP); Ichiro Fukushi, Atsugi (JP); Naoya Ishigaki, Atsugi (JP); Koji Inoue, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 11/391,651

(22) Filed: Mar. 27, 2006

(65) Prior Publication Data

US 2006/0171436 A1 Aug. 3, 2006

Related U.S. Application Data

(62) Division of application No. 10/791,388, filed on Mar. 2, 2004, now Pat. No. 7,145,924.

(30) Foreign Application Priority Data

| Mar. 27, 2003 | (JP) | ............................. 2003-086653 |
| Mar. 28, 2003 | (JP) | ............................. 2003-089554 |
| May 1, 2003 | (JP) | ............................. 2003-126117 |

(51) Int. Cl.
*H01S 5/00* (2006.01)
(52) U.S. Cl. ..................... 372/43.01; 372/21; 372/22
(58) Field of Classification Search ............ 372/43.01, 372/21, 22
See application file for complete search history.

(56) References Cited

U.S. PATENT DOCUMENTS 4,953,166 A 8/1990 Mooradian 5,303,250 A * 4/1994 Masuda et al. ................. 372/9
2003/0067947 A1 4/2003 Zhang et al.

FOREIGN PATENT DOCUMENTS

| JP | 4-503429 | 6/1992 |
| JP | 7-106682 | 4/1995 |
| WO | WO-90/09688 | 8/1990 |

* cited by examiner

*Primary Examiner*—Dung Nguyen
(74) *Attorney, Agent, or Firm*—Jordan and Hamburg LLP

(57) ABSTRACT

A solid laser apparatus has either a combination of a lowpass filter (9c) and a highpass filter (9d) or a bandpass filter 9f provided in its output control circuit (8, 9, 10) for increasing the gain and adjusting the phase of a signal in the vicinity of the relaxation oscillating frequency.

Also, a solid laser apparatus has the phase shift circuit (9g) provided in its output control circuit (8,9,10) for advancing the phase of a signal in the vicinity of the relaxation oscillating frequency thereof.

Moreover, a solid laser apparatus has a pseudo notch filter (9h), which is arranged for the gain to have a local minimum at the relaxation oscillating frequency of the solid laser apparatus, provided in the output control circuit (8,9,10) so that the peak of the gain transmission characteristic of the nonlinear optical device (4) or of a combination of the nonlinear optical device (4) and the microchip laser crystal (3) is offset.

14 Claims, 13 Drawing Sheets

Fig. 1
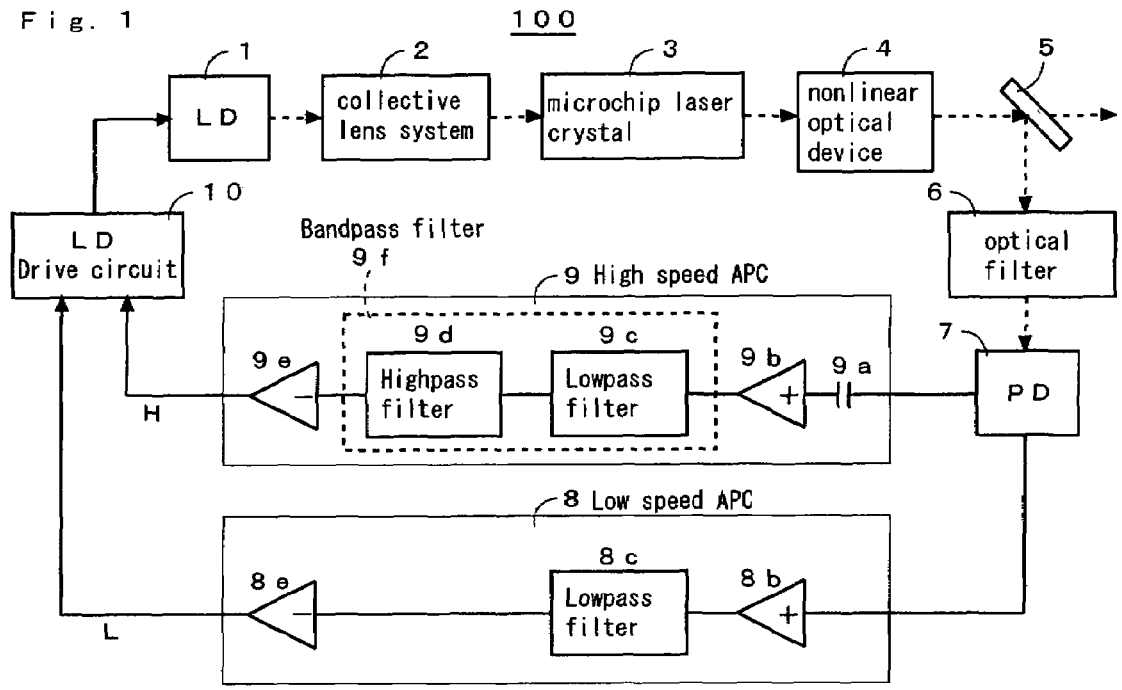
Fig. 2
(a) 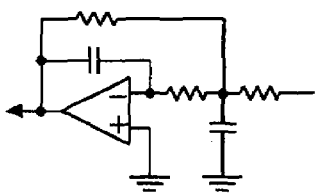 (b) 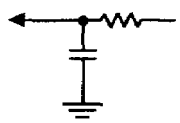
Fig. 3
(a) 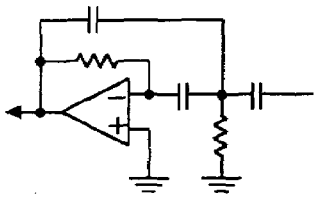 (b) 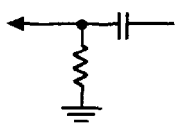

Fig. 12
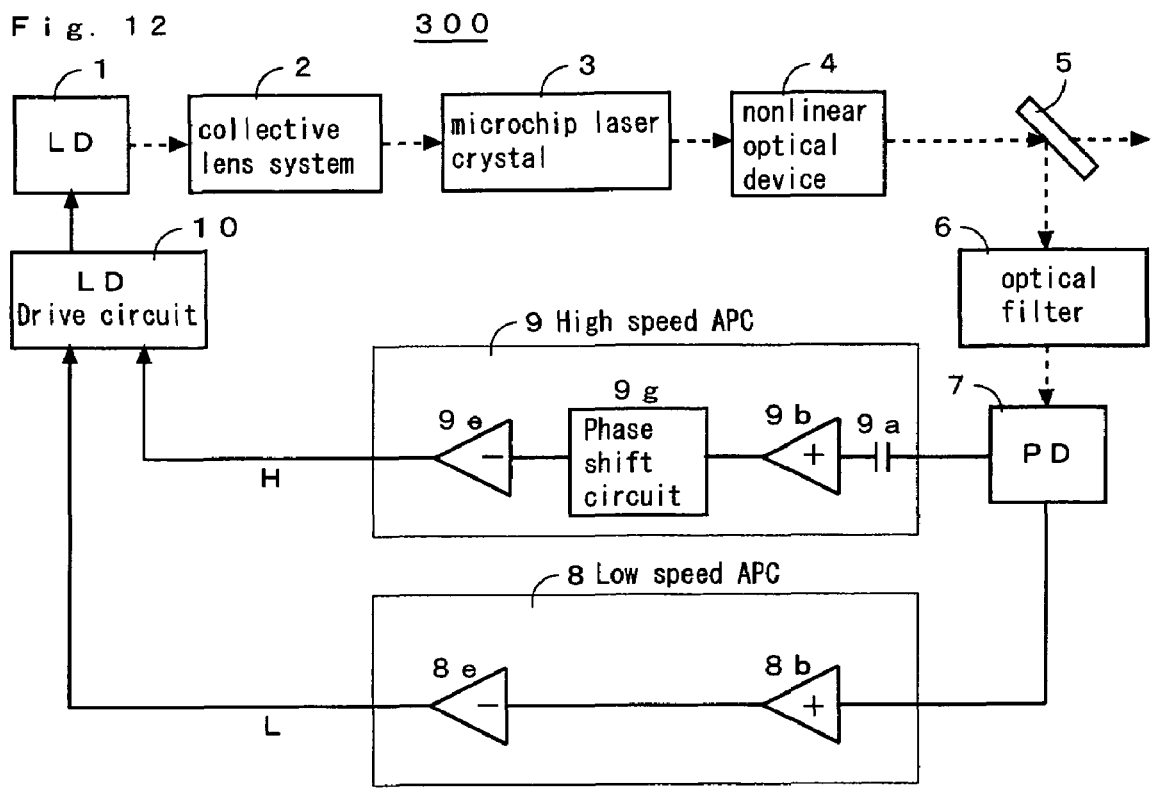
Fig. 13 (a)
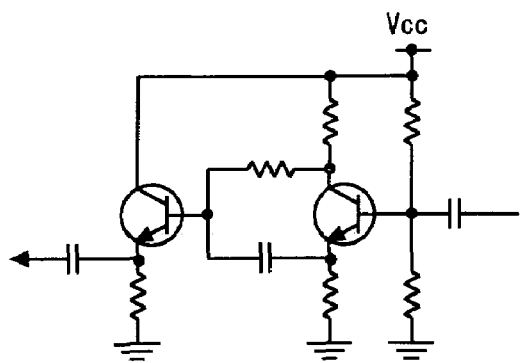
(b)
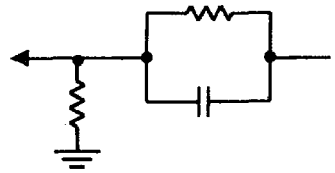

Fig. 19    600

SOLID LASER APPARATUS

This is a Divisional application of Ser. No. 10/791,388 filed Mar. 2, 2004 which is now U.S. Pat. No. 7,145,924.

FIELD OF THE INVENTION

The present invention relates to a solid laser apparatus and more particularly to a solid laser apparatus which can effectively attenuate optical noises.

BACKGROUND OF THE INVENTION

A solid laser apparatus is known comprising a semiconductor laser for generating a laser beam, a nonlinear optical device for receiving the laser beam from the semiconductor laser and emitting its harmonic light, an optical detecting means used as a monitor for detecting the intensity of the light emitted from the nonlinear optical device, and an output control circuit for driving the semiconductor laser so as to maintain the intensity of the light at a predetermined level (See Citation 1).

Another solid laser apparatus is known having a microchip laser crystal designed for being excited by the laser beam emitted from a semiconductor laser, provided with its crystal end faces coated for use as an optical resonator, and located at the upstream of an nonlinear optical device (See Citation 2).

Citation 1 disclosed in Japanese Patent Laid-open Publication (Heisei)7-106682.

Citation 2 disclosed in Japanese Patent Laid-open Publication (Heisei)4-503429.

(Problems that the Invention is to Solve)

FIG. 20 illustrates an actual measurement profile of gain transmission characteristic and phase transmission characteristic of the nonlinear optical device and the microchip laser crystal in such a conventional solid laser apparatus.

As shown in FIG. 20, the gain peak of a signal appears about 11 MHz. The frequency at the gain peak is referred to as a relaxation oscillating frequency fk of the solid laser apparatus. Also, the profile of FIG. 20 illustrates the phase of the signal is inverted around the relaxation oscillating frequency fk and retarded by substantially 90 degrees in the vicinity of the relaxation oscillating frequency fk.

FIG. 21 illustrates a measurement profile of optical noise waveforms in the solid laser apparatus.

The profile of FIG. 21 illustrates the oscillating frequency of optical noise at substantially 11 MHz which is equal to the relaxation oscillating frequency fk shown in FIG. 20.

The solid laser apparatus having the phase transmission characteristic shown in FIG. 20 allows a range of frequencies lower than the relaxation oscillating frequency fk to be successfully controlled by the negative feedback controlling action of the output control circuit.

However, if a range of frequencies higher than the relaxation oscillating frequency fk contains any external interruption such as a circuitry noise due to the inversion of the phase transmission characteristic in the vicinity of the relaxation oscillating frequency fk as shown in FIG. 20, it may cause the control system to start oscillation and disturb the negative feedback controlling action thus failing to effectively attenuate the optical noise. Also, if an external interruption such as the circuitry noise is contained in the range of frequencies lower than the relaxation oscillating frequency fk, it may be treated as an optical noise thus allowing the attenuation of optical noise with much difficulty. Moreover, if the optical noise in the vicinity of the relaxation oscillating frequency fk is delayed by substantially 90 degrees in the phase, it may be attenuated only to a limited level by the negative feedback controlling action of the output control circuit.

On the other hand, FIG. 22 illustrates a profile of gain transmission characteristic of the nonlinear optical device and the microchip laser crystal in such a conventional solid laser apparatus.

As shown in FIG. 22, the relaxation oscillating frequency fk of a solid laser apparatus appears about 12 MHz.

FIG. 23 illustrates a profile of phase transmission characteristic of the nonlinear optical device and the microchip laser crystal in the conventional solid laser apparatus.

As shown in FIG. 23, the phase of the signal is inverted in the vicinity of the relaxation oscillating frequency fk.

The solid laser apparatus having the phase transmission characteristic shown in FIG. 23 allows any interruption (low frequency noise) in the output at frequencies lower than the relaxation oscillating frequency fk to be successfully controlled by the negative feedback controlling action of the output control circuit. This is because the common operating frequencies of the solid laser apparatus are sufficiently lower than the relaxation oscillating frequency fk.

However, since the phase transmission characteristic is inverted at the relaxation oscillating frequency fk as shown in FIG. 23, the negative feedback action will be turned to a positive feedback action hence failing to suppress an interruption (high frequency noise) in the output at the frequencies higher than the relaxation oscillating frequency fk.

It is hence an object of the present invention to provide a solid laser apparatus which can effectively attenuate optical noises.

SUMMARY OF THE INVENTION

According to a first aspect of the present invention, a solid laser apparatus having a semiconductor laser for emitting a laser beam, a microchip laser crystal arranged for being excited by the laser beam emitted from the semiconductor laser and provided with its crystal end faces coated for use as an optical resonator, a nonlinear optical device for receiving a laser beam from the microchip laser crystal and emitting its harmonic light, an optical detecting means used as a monitor for detecting the intensity of the light emitted from the nonlinear optical device, and an output control circuit for driving the semiconductor laser so as to maintain the intensity of the light at a predetermined level is provided wherein the output control circuit includes either a combination of a lowpass filter and a highpass filter or a bandpass filter.

Such an optical noise may be generated in the vicinity of the relaxation oscillating frequency fk and remain delayed by substantially 90 degrees in the phase.

Therefore, the optical noise can effectively be attenuated by extracting a target range of the signal in the vicinity of the relaxation oscillating frequency fk and controlling its phase.

The solid laser apparatus of the first aspect includes either a combination of the lowpass filter and the highpass filter or the bandpass filter for minimizing the decay ratio of the signal in the vicinity of the relaxation oscillating frequency fk.

The transmission characteristic by a combination of the lowpass filter and the highpass filter or the bandpass filter allows the decay ratio of the signal to remain high throughout the range of frequencies other than the relaxation oscillating frequency fk. Accordingly, as the external interruption (e.g. circuitry noise) is removed effectively, the range of the signal where the optical noise is carried can be extracted thus effecting the attenuation of the optical noise.

Moreover, the phase of a signal can be advanced in the vicinity of the relaxation oscillating frequency fk by having the cutoff frequency of the highpass filter set higher than the cutoff frequency of the lowpass filter or adjusting the center frequency of the bandpass filter. Accordingly, any phase delay of the optical noise produced in the vicinity of the relaxation oscillating frequency fk can favorably be corrected.

In short, the combination of the lowpass filter and the highpass filter or the bandpass filter allows a target range of the signal where the optical noise is carried to be effectively extracted and subjected to the phase compensation, hence effecting the attenuation of the optical noise through the feedback controlling action of the output control circuit.

According to a second aspect of the present invention, a solid laser apparatus having a semiconductor laser for emitting a laser beam, a nonlinear optical device for receiving a laser beam from the semiconductor laser and emitting its harmonic light, an optical detecting means used as a monitor for detecting the intensity of the light emitted from the nonlinear optical device, and an output control circuit for driving the semiconductor laser so as to maintain the intensity of the light at a predetermined level, wherein the output control circuit includes either a combination of a lowpass filter and a highpass filter or a bandpass filter.

Such an optical noise may be generated in the vicinity of the relaxation oscillating frequency fk and delayed by substantially 90 degrees in the phase.

Therefore, the optical noise can effectively be attenuated by extracting a target range of the signal in the vicinity of the relaxation oscillating frequency fk and controlling its phase.

The solid laser apparatus of the second aspect also includes either a combination of the lowpass filter and the highpass filter or the bandpass filter for minimizing the decay ratio of the signal in the vicinity of the relaxation oscillating frequency fk.

The transmission characteristic by the combination of the lowpass filter and the highpass filter or the bandpass filter allows the decay ratio of the signal to remain high throughout the range of frequencies other than the relaxation oscillating frequency fk. Accordingly, as the external interruption (e.g. circuitry noise) is removed effectively, the range of the signal where the optical noise is carried can be extracted thus effecting the attenuation of the optical noise.

Moreover, the phase can be advanced in the vicinity of the relaxation oscillating frequency fk by having the cutoff frequency of the highpass filter set higher than the cutoff frequency of the lowpass filter or adjusting the center frequency of the bandpass filter. Accordingly, any phase delay of the optical noise produced in the vicinity of the relaxation oscillating frequency fk can favorably be corrected.

In brief, the combination of the lowpass filter and the highpass filter or the bandpass filter allows a target range of the signal where the optical noise is carried to be effectively extracted and subjected to the phase compensation, hence effecting the attenuation of the optical noise through the feedback controlling action of the output control circuit.

According to a third aspect of the present invention, a solid laser apparatus having a semiconductor laser for emitting a laser beam, a microchip laser crystal arranged for being excited by the laser beam emitted from the semiconductor laser and provided with its crystal end faces coated for use as an optical resonator, a nonlinear optical device for receiving a laser beam from the microchip laser crystal and emitting its harmonic light, an optical detecting means used as a monitor for detecting the intensity of the light emitted from the nonlinear optical device, and an output control circuit for driving the semiconductor laser so as to maintain the intensity of the light at a predetermined level is provided wherein the output control circuit includes a phase shift circuit for advancing the phase of a signal in the vicinity of the relaxation oscillating frequency of the solid laser apparatus.

The solid laser apparatus of the third aspect has the phase shift circuit provided for advancing the phase of a signal in the vicinity of the relaxation oscillating frequency thereof. The phase shift characteristic of the phase shift circuit in combination with the phase transmitting characteristic of the nonlinear optical device and the microchip laser crystal then permits the delay in the phase of the signal in the vicinity of the relaxation oscillating frequency to be reduced to almost zero degree, hence enabling the attenuation of any optical noise through the feedback controlling action of the output control circuit.

According to a fourth aspect of the present invention, a solid laser apparatus having a semiconductor laser for emitting a laser beam, a nonlinear optical device for receiving a laser beam from the semiconductor laser and emitting its harmonic light, an optical detecting means used as a monitor for detecting the intensity of the light emitted from the nonlinear optical device, and an output control circuit for driving the semiconductor laser so as to maintain the intensity of the light at a predetermined level is provided wherein the output control circuit includes a phase shift circuit for advancing the phase of a signal in the vicinity of the relaxation oscillating frequency of the solid laser apparatus.

The solid laser apparatus of the fourth aspect has the phase shift circuit provided for advancing the phase of a signal in the vicinity of the relaxation oscillating frequency thereof. The phase shift characteristic of the phase shift circuit in combination with the phase transmitting characteristic of the nonlinear optical device then permits the delay in the phase of the signal in the vicinity of the relaxation oscillating frequency to be reduced to almost zero degree, hence enabling the attenuation of any optical noise through the feedback controlling action of the output control circuit.

According to a fifth aspect of the present invention, a solid laser apparatus having a semiconductor laser for emitting a laser beam, a microchip laser crystal arranged for being excited by the laser beam emitted from the semiconductor laser and provided with its crystal end faces coated for use as an optical resonator, a nonlinear optical device for receiving a laser beam from the microchip laser crystal and emitting its harmonic light, an optical detecting means used as a monitor for detecting the intensity of the light emitted from the nonlinear optical device, and an output control circuit for driving the semiconductor laser so as to maintain the intensity of the light at a predetermined level is provided wherein the output control circuit includes a pseudo notch filter of which gain is arranged to have a local minimum at the relaxation oscillating frequency and not zero at the notch frequency.

The pseudo notch filter, but not an ideal notch filter for minimizing the gain to zero in the vicinity of the relaxation oscillating frequency of the solid laser apparatus, is provided in the above arrangement because its gain characteristic is assumed for gradually decreasing the gain to a local minimum but not zero in the vicinity of the relaxation oscillating frequency.

The solid laser apparatus according to the fifth aspect has the pseudo notch filter arranged for providing a local minimum of the gain in the vicinity of the relaxation oscillating frequency thereof. The gain transmission characteristic of the pseudo notch filter enables to offset the peak of the gain transmission characteristic of the nonlinear optical device and the microchip laser crystal and can thus favorably effect the attenuation of optical noise in the vicinity of the relaxation oscillating frequency. Also, since the phase transmission characteristic of the pseudo notch filter provides inversion of the phase in the vicinity of the relaxation oscillating frequency, its action in combination with the phase transmission characteristic of the nonlinear optical device and the microchip laser crystal allows the phase to remain not inverted in the vicinity of the relaxation oscillating frequency, hence enabling the attenuation of both low frequency noise and high frequency noise through the feedback controlling action of the output control circuit.

According to a sixth aspect of the present invention, a solid laser apparatus having a semiconductor laser for emitting a laser beam, a nonlinear optical device for receiving a laser beam from the semiconductor laser and emitting its harmonic light, an optical detecting means used as a monitor for detecting the intensity of the light emitted from the nonlinear optical device, and an output control circuit for driving the semiconductor laser so as to maintain the intensity of the light at a predetermined level is provided wherein the output control circuit includes a pseudo notch filter of which gain is arranged to have a local minimum at the relaxation oscillating frequency and not zero at the notch frequency.

The pseudo notch filter, but not an ideal notch filter for minimizing the gain to zero in the vicinity of the relaxation oscillating frequency of the solid laser apparatus, is provided in the above arrangement because its gain characteristic is assumed for gradually decreasing the gain to a local minimum but not zero in the vicinity of the relaxation oscillating frequency.

The solid laser apparatus according to the sixth aspect has the pseudo notch filter arranged for providing a local minimum of the gain in the vicinity of the relaxation oscillating frequency thereof. The gain transmission characteristic of the pseudo notch filter enables to offset the peak of the gain transmission characteristic of the nonlinear optical device and can thus favorably effect the attenuation of optical noise in the vicinity of the relaxation oscillating frequency. Also, since the phase transmission characteristic of the pseudo notch filter provides inversion of the phase in the vicinity of the relaxation oscillating frequency, its action in combination with the phase transmission characteristic of the nonlinear optical device allows the phase to remain not inverted in the vicinity of the relaxation oscillating frequency, hence enabling the attenuation of both low frequency noise and high frequency noise through the feedback controlling action of the output control circuit.

ADVANTAGE OF THE INVENTION

As set forth above, the solid laser apparatus according to the present invention has either the combination of the lowpass filter and highpass filter or the bandpass filter provided in the output control circuit for increasing the gain in the vicinity of the relaxation oscillating frequency and carrying out the phase controlling action in the vicinity of the relaxation oscillating frequency. Since the gain becomes low throughout the range of frequencies other than the relaxation oscillating frequency, any external interruption (e.g. circuitry noise) can effectively be rejected thus effecting the attenuation of optical noise.

Also, the solid laser apparatus according to the present invention has the phase shift circuit provided in its output control circuit for advancing the phase of a signal in the vicinity of the relaxation oscillating frequency thereof.

This allows the phase shift action of the phase shift circuit to be operative, thus effecting the attenuation of the optical noise through the feedback controlling action of the output control circuit.

Moreover, the solid laser apparatus according to the present invention has a pseudo notch filter, which is arranged for the gain to have a local minimum at the relaxation oscillating frequency of the solid laser apparatus, provided in the output control circuit so that the peak of the gain transmission characteristic of the nonlinear optical device or of a combination of the nonlinear optical device and the microchip laser crystal is offset, hence effecting the attenuation of optical noise in the vicinity of the relaxation oscillating frequency. Since the phase transmission characteristic of the pseudo notch filter is inverted in the vicinity of the relaxation oscillating frequency, its action in combination with the phase transmission characteristic of the nonlinear optical device or of the nonlinear optical device and the microchip laser crystal, which provides inversion of the phase in the vicinity of the relaxation oscillating frequency, permits the phase to remain not inverted in the vicinity of the relaxation oscillating frequency. Accordingly, both low frequency noise and high frequency noise can effectively be attenuated by the feedback controlling action of the output control circuit.

BRIEF DESCRIPTION OF THE DRAWINGS

FIG. 1 is a schematic view of a solid laser apparatus showing the first embodiment of the present invention;

FIG. 2 is a circuitry diagram showing an exemplary circuit of the lowpass filter;

FIG. 3 is a circuitry diagram showing an exemplary circuit of the highpass filter;

FIG. 12 is a schematic view of a solid laser apparatus showing the third embodiment of the present invention;

FIG. 13 is a circuitry diagram showing an exemplary circuit of the phase shift circuit;

BEST MODES FOR EMBODYING THE INVENTION

Figure 4:
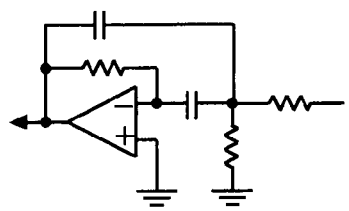
FIG. 4 is a circuitry diagram showing an exemplary circuit of the bandpass filter.

Preferred embodiments of the present invention will now be described referring to the relevant drawings. It would be understood that the present invention is not limited to the described embodiments.

First Embodiment

FIG. 1 is a schematic diagram of a solid laser apparatus 100 showing the first embodiment of the present invention.

The solid laser apparatus 100 comprises a semiconductor laser 1 for generating a laser beam, a collective lens system 2 for focusing the laser beam, a microchip laser crystal 3 provided with its crystal end faces coated for use as an optical resonator which can be excited by the focused laser beam, a nonlinear optical device 4 for receiving the laser beam from the microchip laser crystal 3 and emitting its harmonic light, an assembly of a splitter 5, an optical filter 6, and a photo diode 7 for detecting the intensity of the light emitted from the nonlinear optical device 4, a low speed APC (automatic power control) circuit 8 for releasing a control signal L to set the intensity of the beam detected by the photo diode 7 to a predetermined level, a high speed APC circuit 9 for releasing a control signal H to attenuate noise components in the beam detected by the photo diode 7 to zero, and an LD drive circuit 10 for supplying the semiconductor laser 1 with a driving current determined by the control signals L and H.

The low speed APC circuit 8 includes a signal amplifier circuit 8b, a lowpass filter 8c, and a signal inverse amplifier circuit 8e.

The high speed APC circuit 9 includes a coupling capacitor 9a, a signal amplifier circuit 9b, a lowpass filter 9c, a highpass filter 9d, and a signal inverse amplifier circuit 9e. The lowpass filter 9c and the highpass filter 9d may be replaced by a bandpass filter 9f.

FIG. 2 illustrates an exemplary circuit of each of the lowpass filters 8c and 9c.

The circuit of FIG. 2 may be either (a) or (b).

FIG. 3 illustrates an exemplary circuit of the highpass filter 9d.

The circuit of FIG. 3 may be either (a) or (b).

FIG. 4 illustrates an exemplary circuit of the bandpass filter 9f.

The circuit of FIG. 2 may be either (a) or (b).

Figure 5:
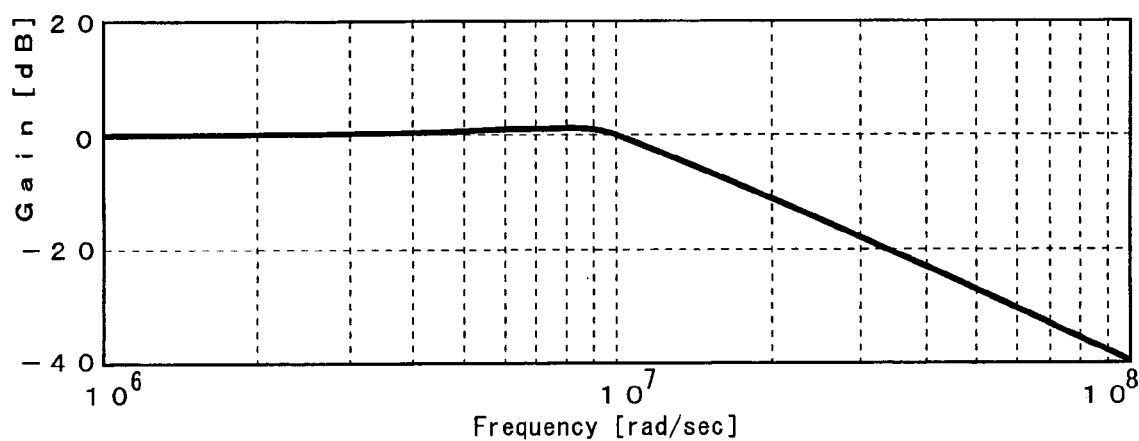
FIG. 5 is a profile of grain transmission function in the lowpass filter.

FIG. 5 illustrates a profile of gain transmission characteristic in the lowpass filters 8c and 9c.

Figure 7:
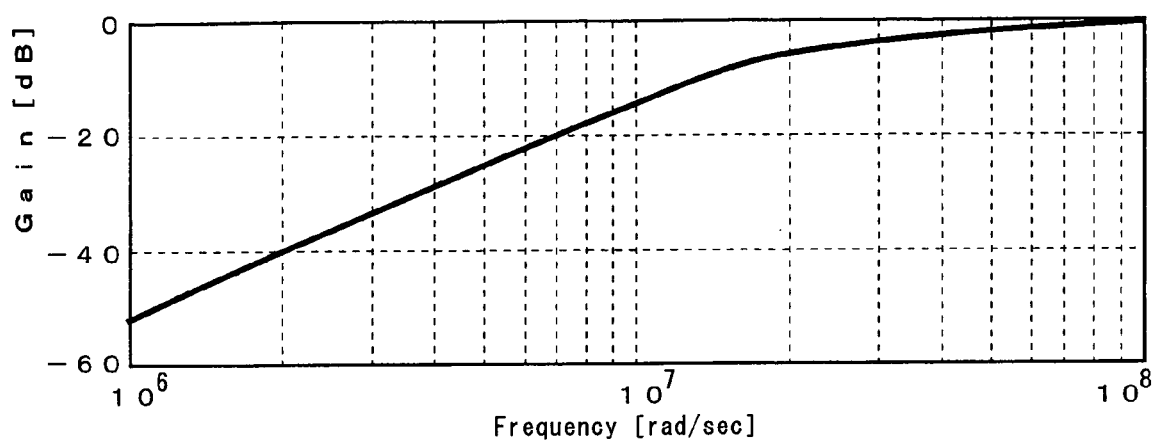
FIG. 7 is a profile of grain transmission function in the highpass filter.

FIG. 7 illustrates a profile of gain transmission characteristic in the highpass filter 9d.

Since the transmission characteristic in a combination of the lowpass filter 9c and the highpass filter 9d allows the gain to be declined throughout the range of frequencies other than the relaxation oscillating frequency fk, it can effectively reject any external interruption (e.g. circuitry noise) thus effecting the attenuation of optical noise.

Figure 6:
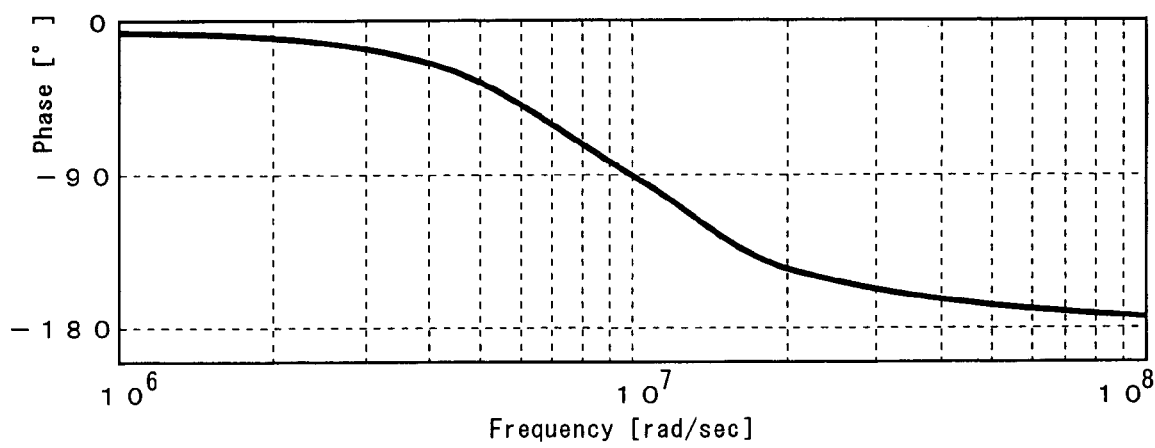
FIG. 6 is a profile of phase transmission function in the lowpass filter.

FIG. 6 illustrates a profile of phase transmission characteristic in each of the lowpass filters 8c and 9c.

Figure 8:
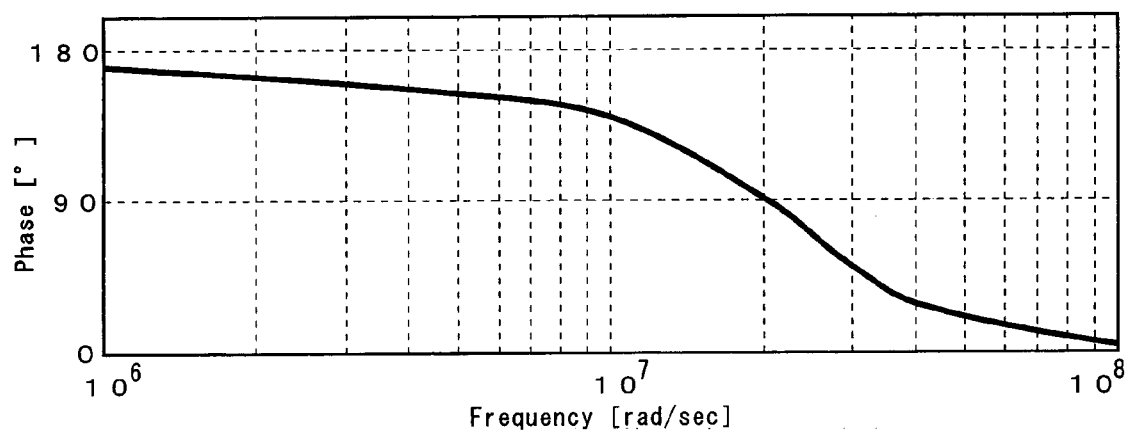
FIG. 8 is a profile of phase transmission function in the highpass filter.

FIG. 8 illustrates a profile of phase transmission characteristic in the highpass filter 9d.

Since the cutoff frequency of the highpass filter 9d is determined higher than the cutoff frequency of the lowpass filter 9c, the phase at the relaxation oscillating frequency fk can be advanced hence permitting any phase delay of the optical noise produced in the vicinity of the relaxation oscillating frequency fk to be corrected.

The combination of the lowpass filter 9c and the highpass filter 9d permits a range of the signal where the optical noise is carried to be extracted and subjected to the phase compensation and can hence effectively attenuate the optical noise through the feedback controlling action of the high speed APC circuit 9.

The degree of each of the lowpass filter 9c and the highpass filter 9d can arbitrarily be determined.

Figure 9:
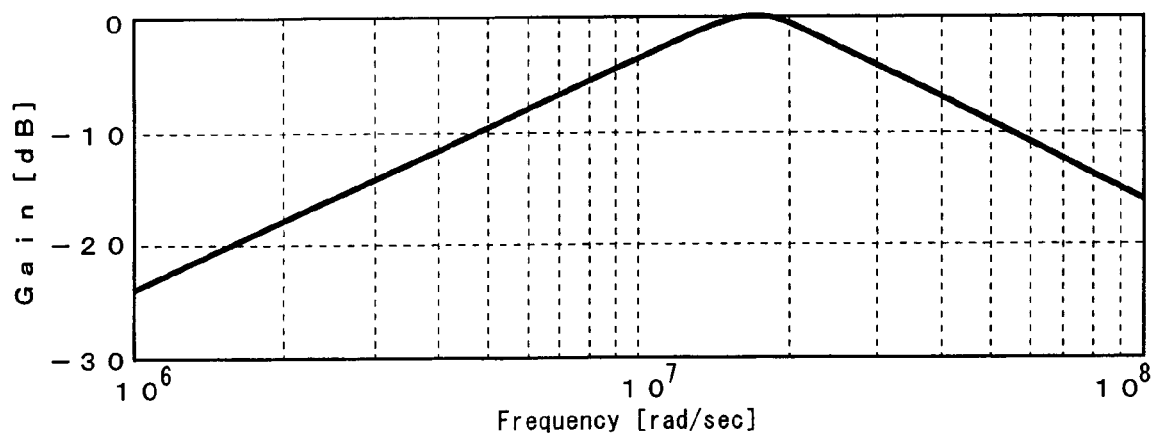
FIG. 9 is a profile of gain transmission function in the bandpass filter.

FIG. 9 illustrates a profile of gain transmission characteristic in the bandpass filter 9f.

Figure 10:
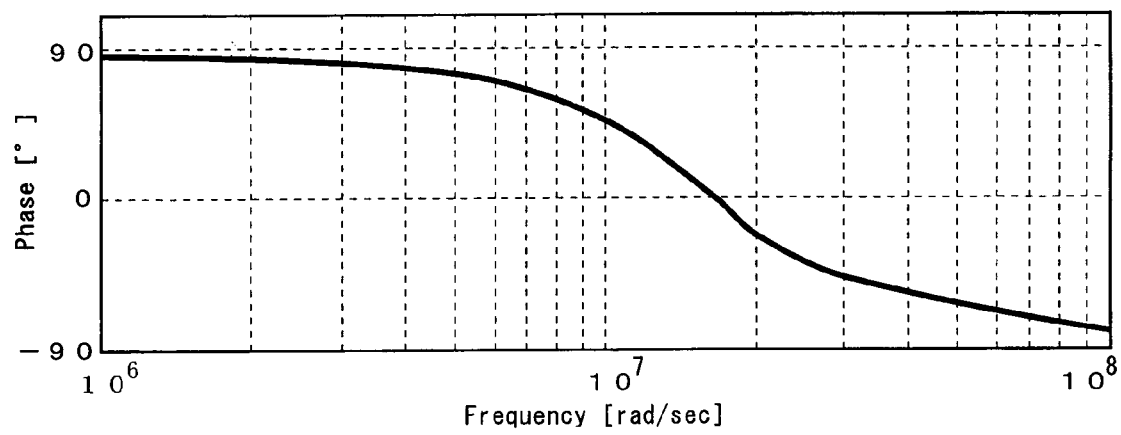
FIG. 10 is a profile of phase transmission function in the bandpass filter.

FIG. 10 illustrates a profile of phase transmission characteristic in the bandpass filter 9f.

Since both the center frequency and the degree of the bandpass filter 9f is desirably determined, they can allows a range of the signal where the optical noise is carried to be extracted and subjected to the phase compensation, hence effecting the attenuation of the optical noise through the feedback controlling action of the high speed APC circuit 9.

Second Embodiment

Figure 11:
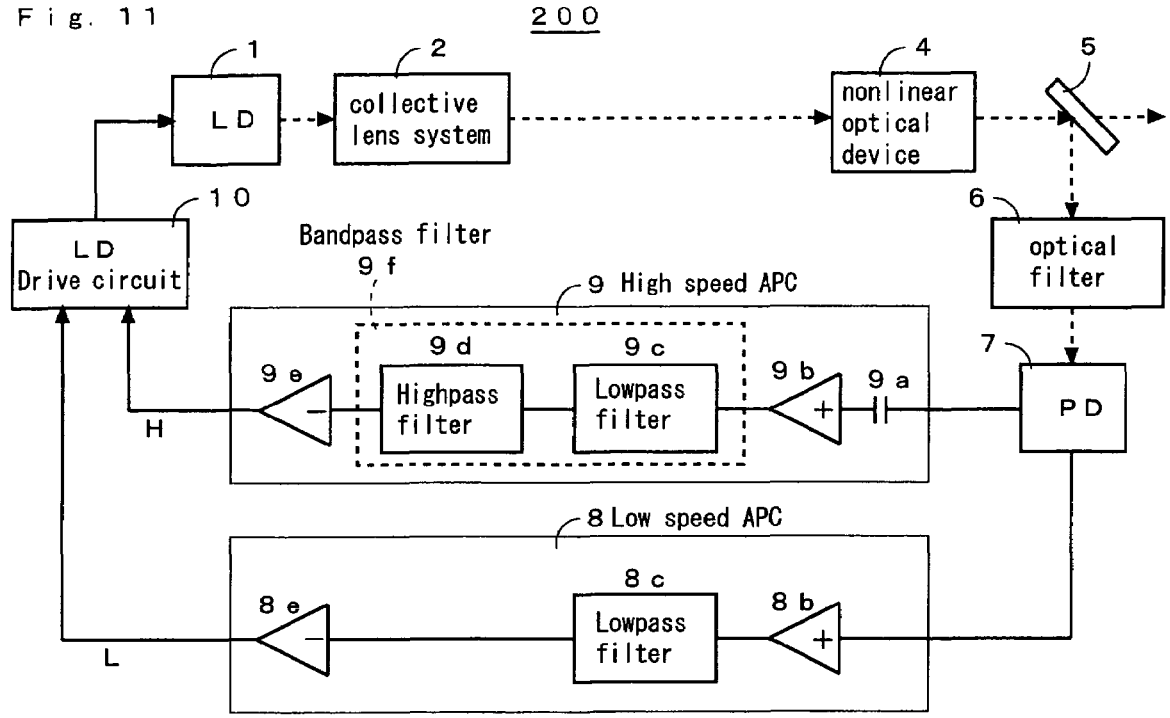
FIG. 11 is a schematic view of a solid laser apparatus showing the second embodiment of the present invention.

FIG. 11 is a schematic view of a solid laser apparatus 200 showing the second embodiment of the present invention.

The solid laser apparatus 200 is identical in the construction to the solid laser apparatus 100 of the first embodiment, except that the microchip laser crystal 3 is eliminated.

The solid laser apparatus 200 provides the same advantages as the solid laser apparatus 100 of the first embodiment. More specifically, the combination of a lowpass filter 9c and a highpass filter 9d can allow any optical noise to be effectively attenuated through the feedback controlling action of a high speed APC circuit 9.

Third Embodiment

FIG. 12 is a schematic diagram of a solid laser apparatus 300 showing the third embodiment of the present invention.

The solid laser apparatus 300 comprises a semiconductor laser 1 for generating a laser beam, a collective lens system 2 for focusing the laser beam, a microchip laser crystal 3 provided with its crystal end faces coated for use as an optical resonator which can be excited by the focused laser beam, a nonlinear optical device 4 for receiving the laser beam from the microchip laser crystal 3 and emitting its harmonic light, an assembly of a splitter 5, an optical filter 6, and a photo diode 7 for detecting the intensity of the light emitted from the nonlinear optical device 4, a low speed APC (automatic power control) circuit 8 for releasing a control signal L to set the intensity of the beam detected by the photo diode 7 to a predetermined level, a high speed APC circuit 9 for releasing a control signal H to attenuate noise components in the beam detected by the photo diode 7 to zero, and an LD drive circuit 10 for supplying the semiconductor laser 1 with a driving current determined by the control signals L and H.

The low speed APC circuit 8 includes a signal amplifier circuit 8b and a signal inverse amplifier circuit 8e.

The high speed APC circuit 9 includes a coupling capacitor 9a, a signal amplifier circuit 9b, a phase shift circuit 9g, and a signal inverse amplifier circuit 9e.

FIG. 13 illustrates an exemplary circuit of the phase shift circuit 9g.

The phase shift circuit 9g is designed for advancing the phase of a signal by, e.g., 90 degrees in the vicinity of the relaxation oscillating frequency fk. Actually, the phase shift may be determined to cancel a delay in the whole system (including delays along the other electric circuits and transmission cables).

Figure 22:
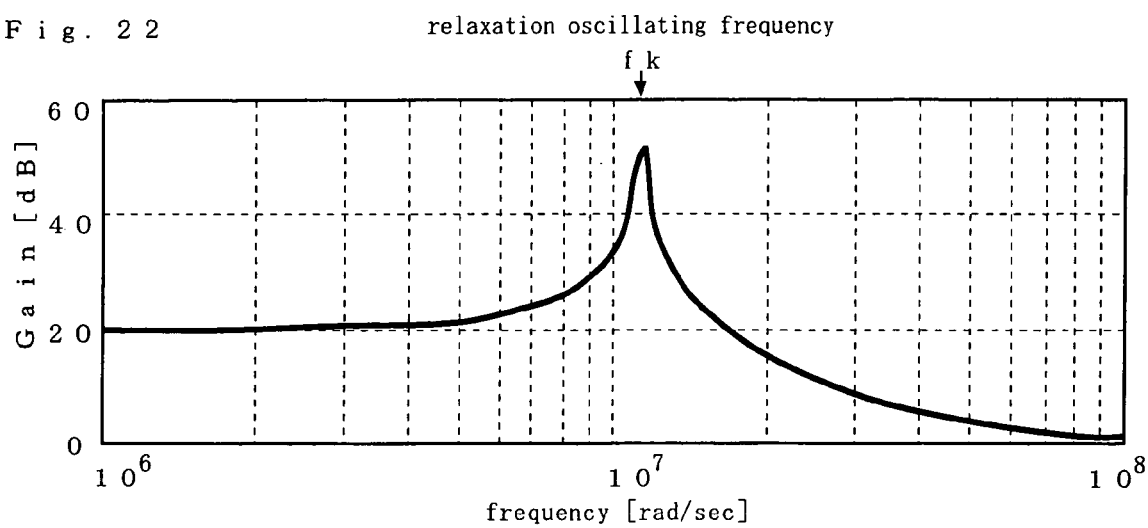
FIG. 22 is a profile of the gain transmission characteristic of a nonlinear optical device or of a nonlinear optical device and a microchip laser crystal in a conventional solid laser apparatus.

Meanwhile as shown in FIG. 22, the phase transmission function of the nonlinear optical device 4 and the microchip laser crystal 3 has a 90-degree delay in the vicinity of the relaxation oscillating frequency fk where the optical noise is carried.

Accordingly, a combination of the phase transmission function of the nonlinear optical device 4 and the microchip laser crystal 3 and the phase transmission function of the phase shift circuit 9g allows the phase delay to be reduced to zero in the vicinity of the relaxation oscillating frequency fk, hence enabling the attenuation of the optical noise through the feedback controlling action of the high speed APC circuit 9.

Fourth Embodiment

Figure 14:
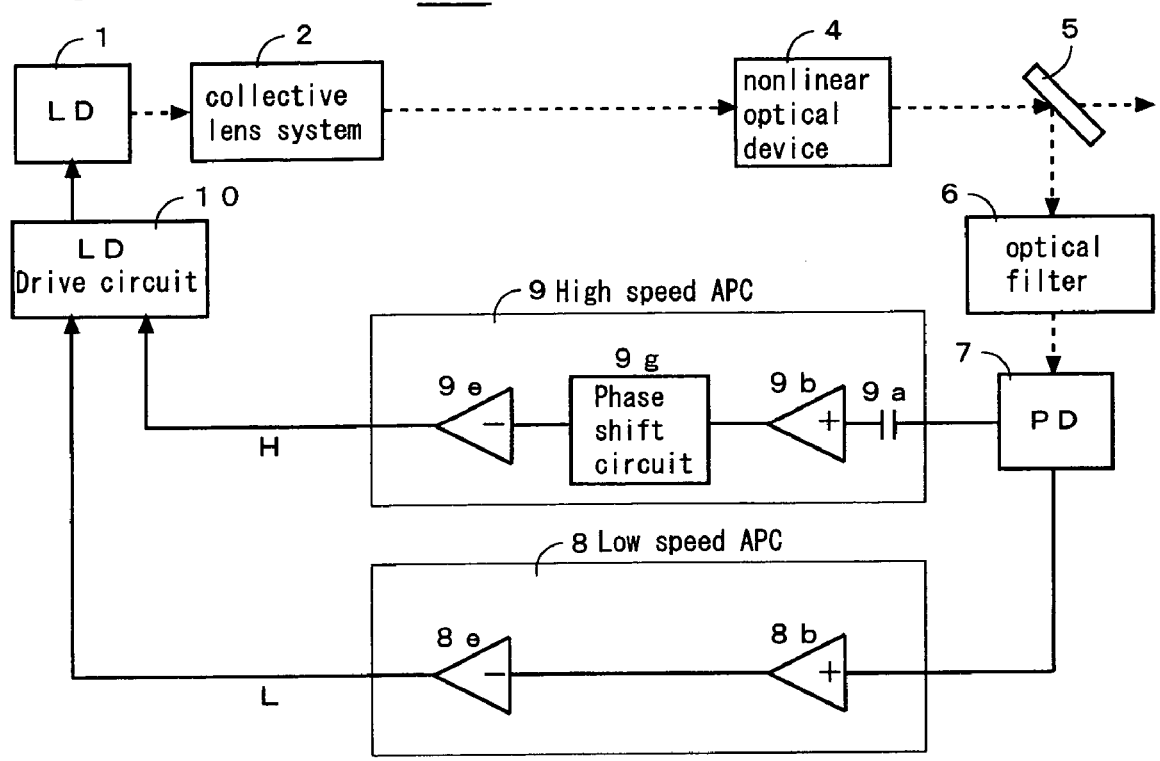
FIG. 14 is a schematic view of a solid laser apparatus showing the fourth embodiment of the present invention.

FIG. 14 is a schematic view of a solid laser apparatus 400 showing the second embodiment of the present invention.

The solid laser apparatus 400 is identical in the construction to the solid laser apparatus 300 of the first embodiment, except that the microchip laser crystal 3 is eliminated.

The solid laser apparatus 400 provides the same advantages as the solid laser apparatus 300 of the first embodiment. In brief, the attenuation of optical noise can be carried out through the feedback controlling action of a high speed APC circuit 9.

Fifth Embodiment

Figure 15:
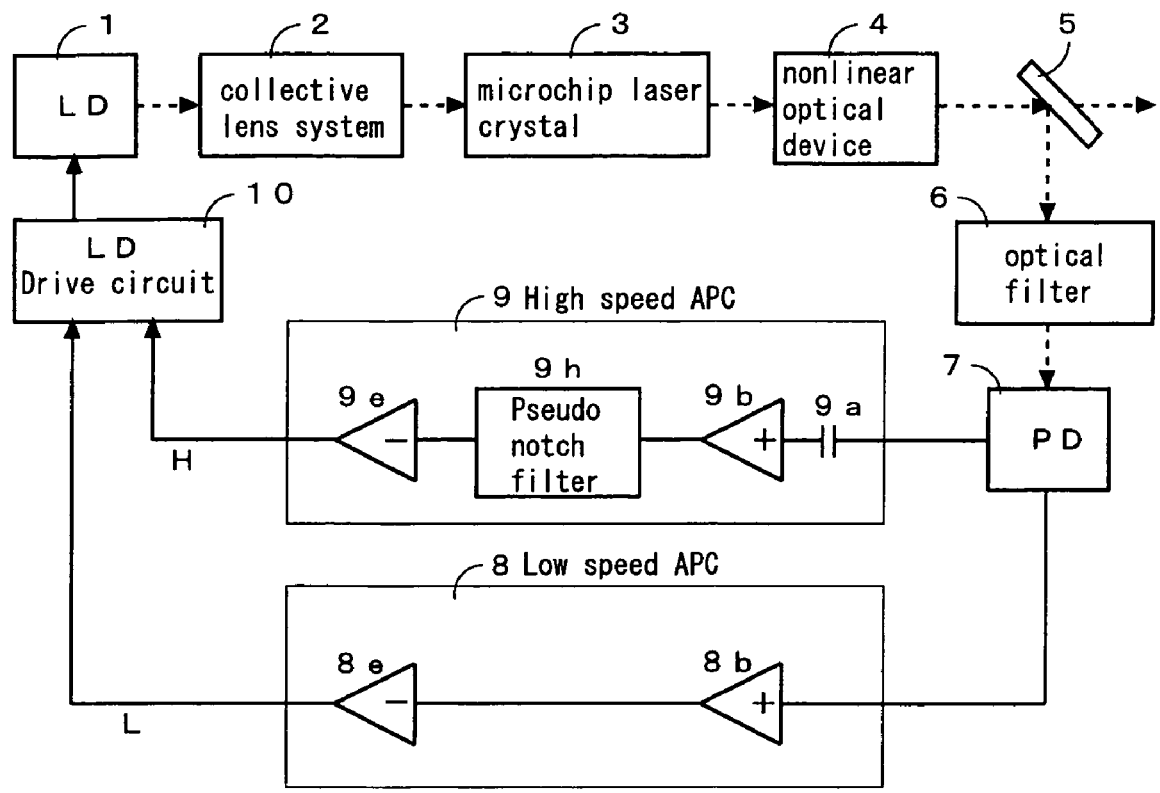
FIG. 15 is a schematic view of a solid laser apparatus showing the fifth embodiment of the present invention.

FIG. 15 is a schematic diagram of a solid laser apparatus 500 showing the first embodiment of the present invention.

The solid laser apparatus 500 comprises a semiconductor laser 1 for generating a laser beam, a collective lens system 2 for focusing the laser beam, a microchip laser crystal 3 provided with its crystal end faces coated for use as an optical resonator which can be excited by the focused laser beam, a nonlinear optical device 4 for receiving the laser beam from the microchip laser crystal 3 and emitting its harmonic light, an assembly of a splitter 5, an optical filter 6, and a photo diode 7 for detecting the intensity of the light emitted from the nonlinear optical device 4, a low speed APC (automatic power control) circuit 8 for releasing a control signal L to set the intensity of the beam detected by the photo diode 7 to a predetermined level, a high speed APC circuit 9 for releasing a control signal H to attenuate noise components in the beam detected by the photo diode 7 to zero, and an LD drive circuit 10 for supplying the semiconductor laser 1 with a driving current determined by the control signals L and H.

The low speed APC circuit 8 includes a signal amplifier circuit 8b and a signal inverse amplifier circuit 8e for suppressing any fluctuation in the DC level of optical output.

The high speed APC circuit 9 includes a coupling capacitor 9a, a signal amplifier circuit 9b, a pseudo notch filter 9h, and a signal inverse amplifier circuit 9e.

Figure 16:
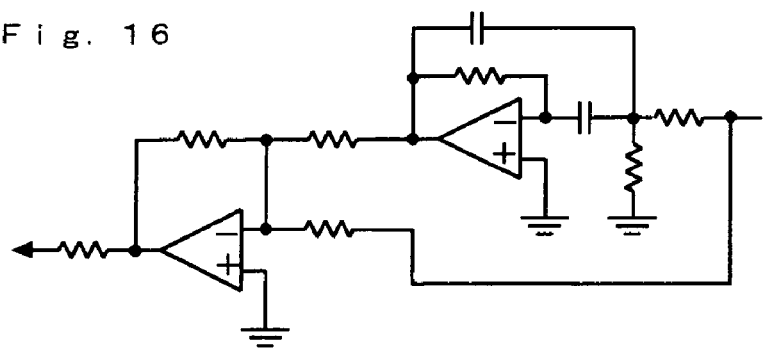
FIG. 16 is a circuitry diagram showing an exemplary circuit of the pseudo notch filter.

FIG. 16 illustrates an exemplary circuit of the pseudo notch filter 9h.

Figure 17:
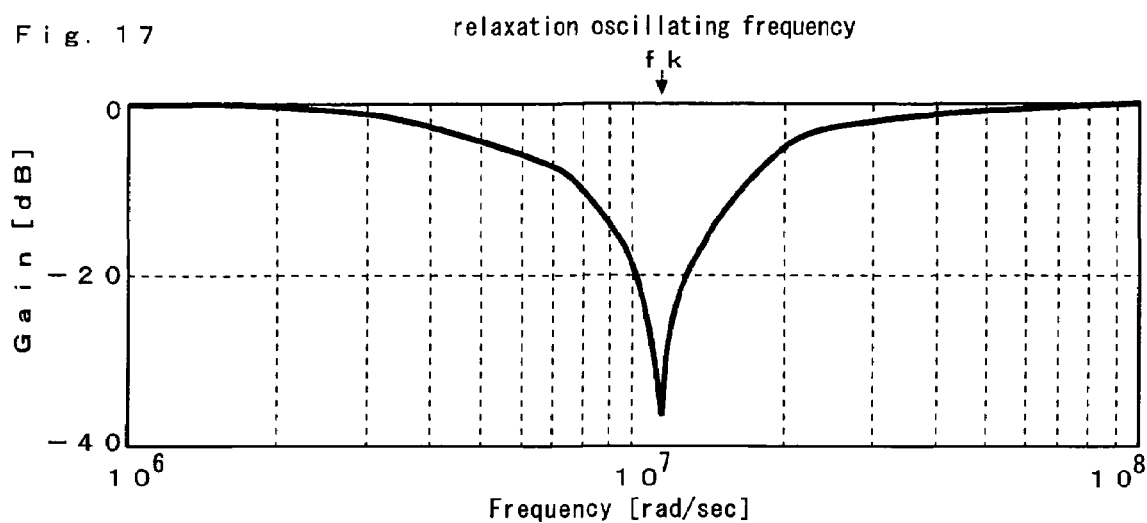
FIG. 17 is a profile of grain transmission function in the pseudo notch filter.

FIG. 17 illustrates a profile of the gain transmission characteristic in the pseudo notch filter 9h.

The pseudo notch filter 9h is characterized for the gain gradually decreasing towards and becoming local minimum in the vicinity of the relaxation oscillating frequency fk of the nonlinear optical device 4 and the microchip laser crystal 3. As the result, the pseudo notch filter 9h can offset the peak of the gain transmission characteristic of the nonlinear optical device 4 and the microchip laser crystal 3, hence enabling the attenuation of optical noise in the vicinity of the relaxation oscillating frequency fk.

Figure 18:
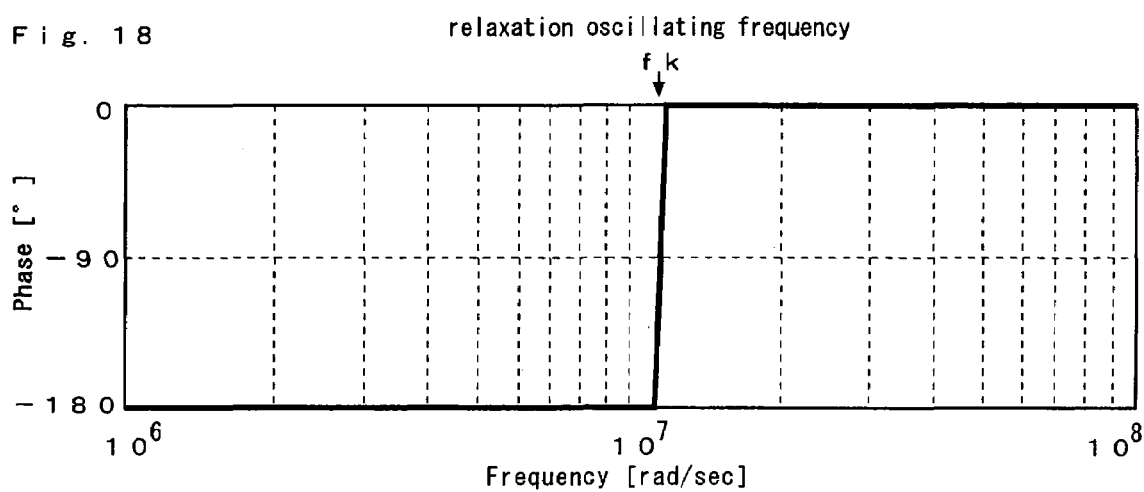
FIG. 18 is a profile of phase transmission function in the pseudo notch filter.

FIG. 18 illustrates a profile of the phase transmission characteristic in the pseudo notch filter 9h.

The pseudo notch filter 9h allows the phase of a signal to be inverted in the vicinity of the relaxation oscillating frequency fk or notch frequency. More particularly, the phase is −180 degrees at frequencies lower than the relaxation oscillating frequency fk and zero degree at frequencies higher than the same.

Figure 23:
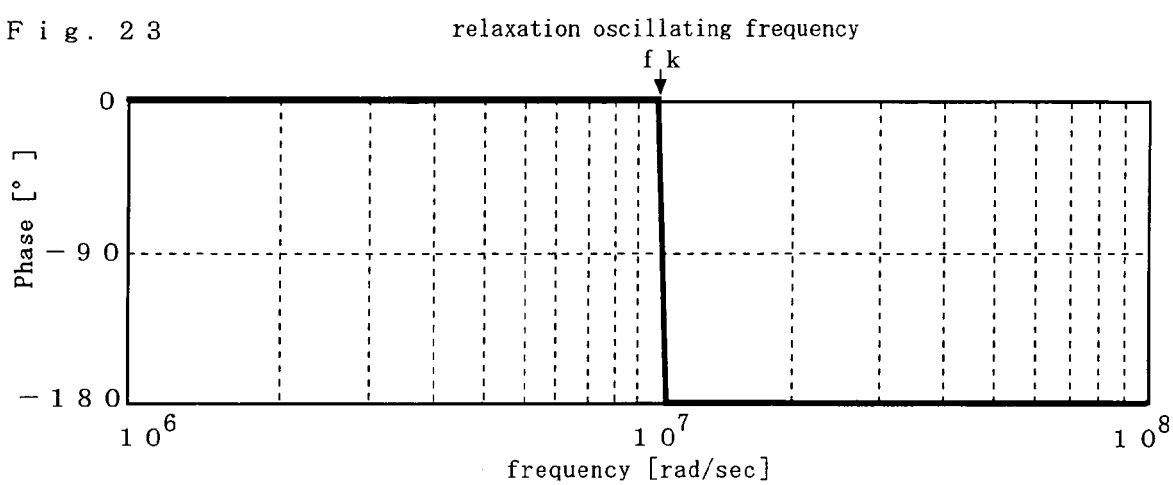
FIG. 23 is a profile of the phase transmission characteristic of the nonlinear optical device or of the nonlinear optical device and the microchip laser crystal in the conventional solid laser apparatus, in which the primary components are 1. Semiconductor laser, 3. Microchip laser crystal, 4. Nonlinear optical device, 8. Low speed APC circuit, 8c. Lowpass filter, 9. High speed APC circuit, 9c. Lowpass filter 9d. Highpass filter, 9f. Bandpass filter, 9g. Phase shift circuit, 9h. Pseudo notch filter, 100,200,300,400,500, 600. Solid laser apparatuses.

Meanwhile, the phase in the phase transmission function of the nonlinear optical device 4 and the microchip laser crystal 3 is zero degree at the frequencies lower than the relaxation oscillating frequency fk and −180 degrees at the frequencies higher than the relaxation oscillating frequency fk, as shown in FIG. 23.

Accordingly, the phase transmission function of the pseudo notch filter 9h in combination with that of the nonlinear optical device 4 and the microchip laser crystal 3 can provide −180 degrees of the phase at the frequencies lower than the relaxation oscillating frequency fk as well as the frequencies higher than the relaxation oscillating frequency fk. In short, the inversion of the phase is eliminated in the vicinity of the relaxation oscillating frequency fk.

As the result, the attenuation of both low frequency noise and high frequency noise can successfully be carried out by the feedback controlling action of the high speed APC circuit 9.

Sixth Embodiment

Figure 19:
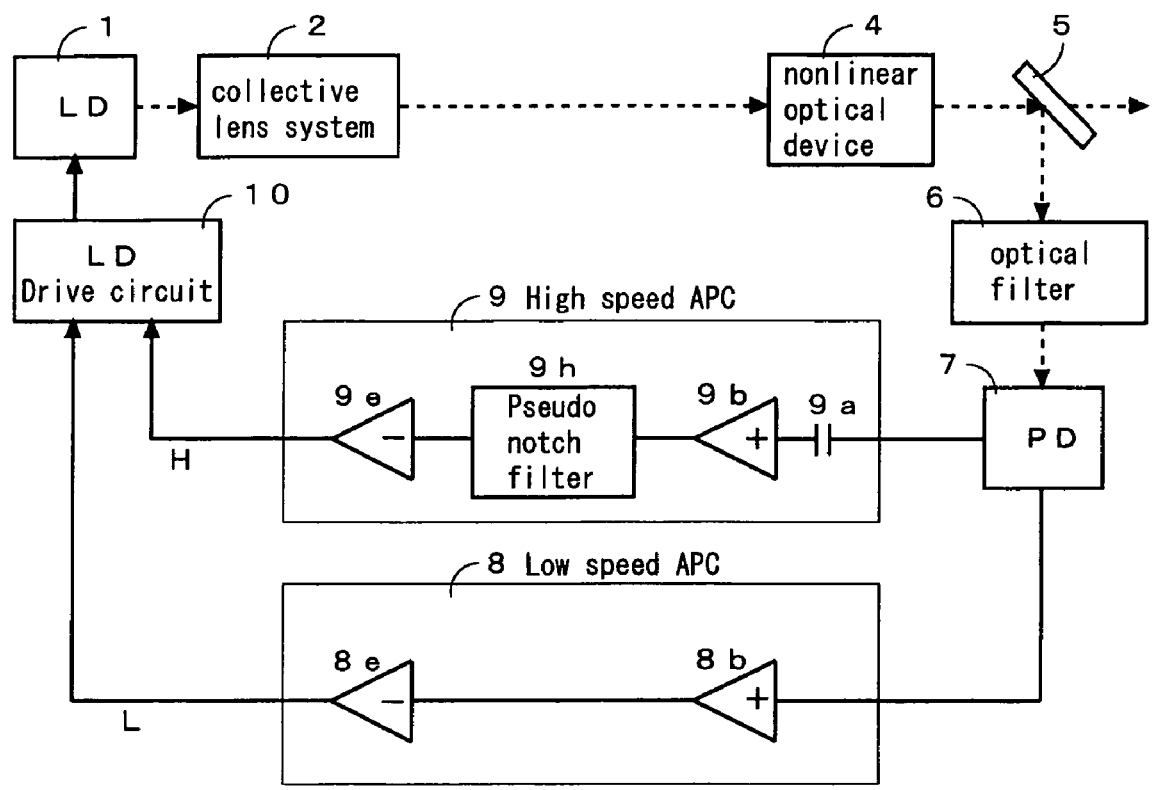
FIG. 19 is a schematic view of a solid laser apparatus showing the sixth embodiment of the present invention.
Figure 20:
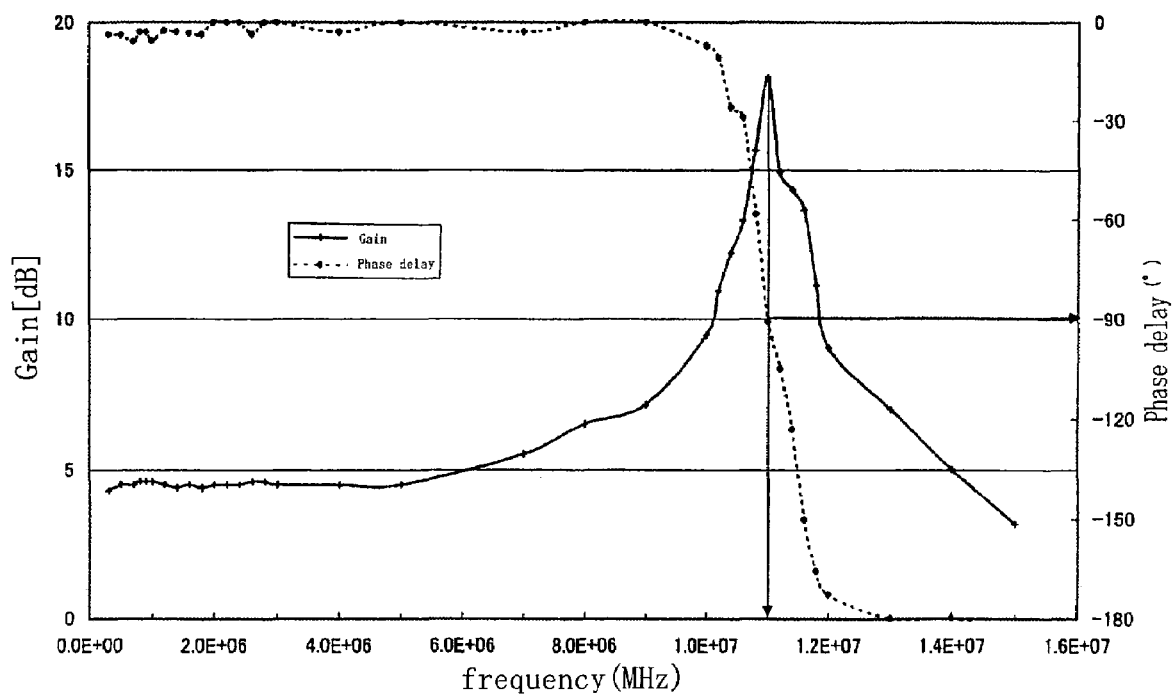
FIG. 20 is an actual measurement profile of the gain transmission characteristic and the phase transmission characteristic of a nonlinear optical device or a microchip laser crystal in a conventional solid laser apparatus.
Figure 21:
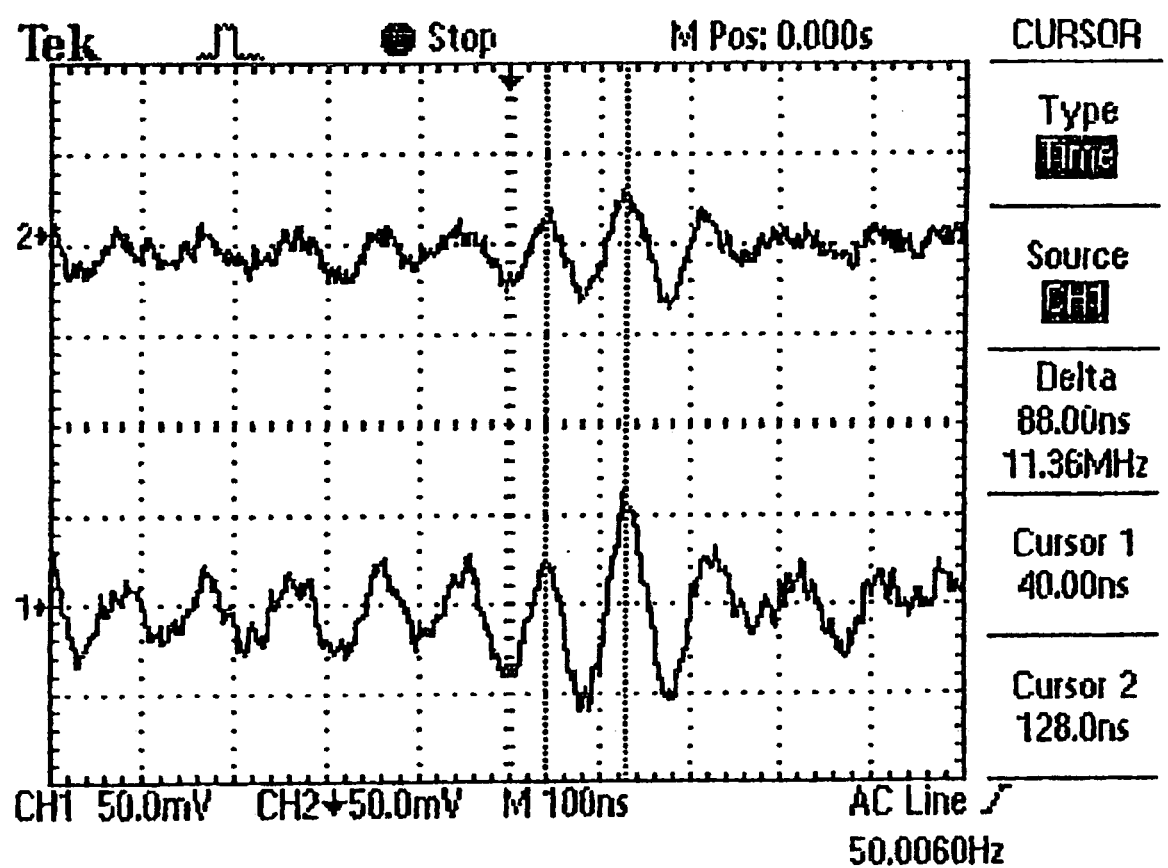
FIG. 21 is an actual measurement profile of optical noise waveform in the conventional solid laser apparatus.

FIG. 19 is a schematic view of a solid laser apparatus 600 showing the second embodiment of the present invention.

The solid laser apparatus 600 is identical in the construction to the solid laser apparatus 500 of the first embodiment, except that the microchip laser crystal 3 is eliminated.

The solid laser apparatus 600 provides the same advantages as the solid laser apparatus 500 of the first embodiment. More specifically, both low frequency noise and high frequency noise can effectively be attenuated by the feedback controlling action of a high speed APC circuit 9.

INDUSTRIAL APPLICABILITY

The solid laser apparatus according to the present invention is allowed to be employed in such as bioengineering field and measuring field.

What is claimed is:

1. A solid laser apparatus comprising:
a semiconductor laser for emitting a laser beam, a microchip laser crystal arranged for being excited by the laser beam emitted from the semiconductor laser and provided with crystal end faces coated for use as an optical resonator, a nonlinear optical device for receiving a laser beam from the microchip laser crystal and emitting a harmonic light of the laser beam, an optical detecting means used as a monitor for detecting an intensity of the harmonic light emitted from the nonlinear optical device, and an output control circuit for driving the semiconductor laser so as to maintain the intensity of the harmonic light at a predetermined level, wherein
the output control circuit includes:
a high-speed feedback circuit having a phase shift circuit for advancing the phase of a signal in vicinity of relaxation oscillating frequency of the solid laser apparatus to effect attenuation of noise in the vicinity of the relaxation frequency; and
a low-speed feedback circuit arranged in parallel with the high-speed feedback circuit.

2. A solid laser apparatus comprising:
a semiconductor laser for emitting a laser beam, a nonlinear optical device for receiving a laser beam from the semiconductor laser and emitting a harmonic light of the laser beam, an optical detecting means used as a monitor for detecting an intensity of the harmonic light emitted from the nonlinear optical device, and an output control circuit for driving the semiconductor laser so as to maintain the intensity of the harmonic light at a predetermined level, wherein
the output control circuit includes:
a high-speed feedback circuit having a phase shift circuit for advancing the phase of a signal in vicinity of relaxation oscillating frequency of the solid laser apparatus to effect attenuation of noise in the vicinity of the relaxation frequency; and
a low-speed feedback circuit arranged in parallel with the high-speed feedback circuit.

3. A laser apparatus comprising:
a laser device for emitting a laser energy, said laser device including a controlling input for controlling a level of the laser energy;
a nonlinear optical device for receiving said laser energy of the laser device and emitting a signal in the form of a harmonic light produced from the laser energy, said nonlinear optical device introducing a −90 degree phase shift into the signal at a predetermined signal frequency;
an optical detector detecting the harmonic light and outputting a detector signal representative of an intensity level of the harmonic light
an output control circuit for driving the controlling input of said laser so as to maintain the intensity level of the harmonic light at a predetermined level, said output control circuit receiving said detector signal and having a phase shifting device having a characteristic introducing a phase shift at said predetermined signal frequency to produce a feedback signal driving said controlling input such that optical noise attenuation is achieved by feedback control at said predetermined frequency, wherein said output control circuit includes:
a high-speed feedback circuit including said phase shifting device producing said phase characteristic at said predetermined frequency to produce a first feedback signal;
a low-speed feedback circuit receiving said detector signal and producing a second feedback signal;
said high-speed feedback circuit and said low-speed feedback circuit being arranged in parallel; and
a drive circuit receiving said first and second feedback signals and driving said controlling input using said first and second feedback signals to produce said feedback signal.

4. The laser apparatus according to claim 3 further comprising a microchip laser crystal arranged for being excited by said laser energy emitted from said laser and provided with crystal end faces coated for use as an optical resonator.

5. The laser apparatus according to claim 4 wherein said high-speed feedback circuit includes:
said phase shifting device being a phase shift circuit which substantially cancels system delay at said predetermined frequency;
an inverter following said phase shift circuit inverting said first feedback signal prior to application to said drive circuit; and
said predetermined frequency being a relaxation frequency of the laser apparatus.

6. The laser apparatus according to claim 3 wherein said high-speed feedback circuit includes:
said phase shifting device being a phase shift circuit which substantially cancels system delay at said predetermined frequency;
an inverter following said phase shift circuit inverting said first feedback signal prior to application to said drive circuit; and
said predetermined frequency being a relaxation frequency of the laser apparatus.

7. The laser apparatus according to claim 4 wherein said high-speed frequency circuit includes a lowpass filter and a highpass filter serially arranged as said phase shifting device.

8. The laser apparatus according to claim 7, wherein a cutoff frequency of the highpass filter is arranged higher than a cutoff frequency of the lowpass filter.

9. The laser apparatus according to claim 3 wherein said high-speed feedback circuit includes a lowpass filter and a highpass filter serially arranged as said phase shifting device.

10. The laser apparatus according to claim 9, wherein a cutoff frequency of the highpass filter is arranged higher than a cutoff frequency of the lowpass filter.

11. The laser apparatus according to claim 4 wherein said high-speed feedback circuit includes a bandpass filter as said phase shifting device, said bandpass filter having a center frequency higher than said predetermined frequency so as to provide said phase characteristic introducing said phase shift.

12. The laser apparatus according to claim 3 wherein said high-speed feedback circuit includes a bandpass filter as said phase shifting device, said bandpass filter having a center frequency higher than said predetermined frequency so as to provide said phase characteristic introducing said phase shift.

13. The laser apparatus according to claim 4 wherein said high-speed feedback circuit includes a pseudo notch filter as said phase shifting device, said pseudo notch filter having a center frequency higher than said predetermined frequency so as to provide said phase characteristic introducing said phase shift.

14. The laser apparatus according to claim 3 wherein said high-speed feedback circuit includes a pseudo notch filter as said phase shifting device, said pseudo notch filter having a center frequency higher than said predetermined frequency so as to provide said phase characteristic introducing said phase shift.

* * * * *